US012787793B2

(12) United States Patent
Latham et al.

(10) Patent No.: US 12,787,793 B2
(45) Date of Patent: Nov. 3, 2026

(54) RESISTANCE TEMPERATURE DETECTOR AT HYBRID BONDING INTERFACE

(71) Applicant: International Business Machines Corporation, Armonk, NY (US)

(72) Inventors: Nicholas Latham, Albany, NY (US); Nicholas Alexander Polomoff, Hopewell Junction, NY (US); Kishan Jayanand, Albany, NY (US); Mukta Ghate Farooq, Hopewell Junction, NY (US); Ashim Dutta, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 368 days.

(21) Appl. No.: 18/643,025

(22) Filed: Apr. 23, 2024

(65) Prior Publication Data

US 2025/0329671 A1 Oct. 23, 2025

(51) Int. Cl.
*H10W 44/00* (2026.01)
*H10W 20/40* (2026.01)
(Continued)

(52) U.S. Cl.
CPC ..... *H10W 44/401* (2026.01); *H10W 20/4421* (2026.01); *H10W 20/498* (2026.01); *H10W 90/794* (2026.01)

(58) Field of Classification Search
CPC ........... H10W 44/401; H10W 20/4421; H10W 20/498; H10W 90/794
See application file for complete search history.

(56) References Cited

U.S. PATENT DOCUMENTS 6,642,738 B2 11/2003 Elbanhawy
9,312,229 B2 4/2016 Chen et al.
(Continued)

FOREIGN PATENT DOCUMENTS

CN 110945650 A * 3/2020 .......... H10W 20/023
CN 114485797 A * 5/2022 ............... B81B 7/02
(Continued)

OTHER PUBLICATIONS

Avenas, Y., et al., "Temperature Measurement of Power Semiconductor Devices by Thermo-Sensitive Electrical Parameters—A Review", IEEE Transactions on Power Electronics, Institute of Electrical and Electronics Engineers (IEEE), Submitted on Oct. 10, 2014, pp. 3081-3092, 27 (6).

*Primary Examiner* — Mohammed Shamsuzzaman
(74) *Attorney, Agent, or Firm* — Scully, Scott, Murphy & Presser, P.C.; Kristofer Haggerty

(57) ABSTRACT

A structure is provided that includes a hybrid bonding interface located between a resistance temperature detector (RTD)-containing structure and a device-containing structure. In such a structure, the RTD-containing structure includes RTD wiring including a first RTD wiring region electrically connected to a RTD resistive element, and a second RTD wiring region electrically connected to the first RTD wiring region. The device-containing structure includes a first electrically conductive interconnect region and a second electrically conductive interconnect region. In the structure, the RTD resistive element is electrically connected to the first electrically conductive interconnect region at the hybrid bonding interface and the second electrically conductive interconnect region is electrically connected to the second RTD wiring region at the hybrid bonding interface.

13 Claims, 2 Drawing Sheets

(51) Int. Cl.
*H10W 20/44* (2026.01)
*H10W 90/00* (2026.01)

(56) References Cited

U.S. PATENT DOCUMENTS 10,354,972 B2 7/2019 Liu et al.
10,782,190 B1 * 9/2020 Gregory .............. C04B 41/4515
10,811,388 B2 10/2020 Haba et al.
11,322,481 B2 5/2022 Wu et al.
2010/0078753 A1 * 4/2010 Mehregany ........... G01F 1/6845 438/54
2014/0015088 A1 * 1/2014 Chapelon ................. G01K 5/56 257/737
2014/0117546 A1 5/2014 Liu et al.
2017/0178994 A1 * 6/2017 Hui ....................... H10W 40/10
2018/0174940 A1 * 6/2018 Ferguson .............. H10W 40/10
2020/0321262 A1 * 10/2020 Schweikert .............. G01K 1/14
2022/0399310 A1 * 12/2022 Sharma ............... H10W 20/023
2022/0415742 A1 * 12/2022 Sahu ..................... H10W 20/20
2023/0201952 A1 * 6/2023 Shah ...................... B23K 20/02 228/3.1
2025/0015041 A1 * 1/2025 Chen ................... H10W 20/023
2025/0079364 A1 * 3/2025 Uzoh .................... H10W 90/00
2025/0266303 A1 * 8/2025 Hsu ....................... H10P 74/207
2025/0383236 A1 * 12/2025 Gaitonde .............. G01J 5/0007
2026/0049873 A1 * 2/2026 Rettner .................... G01K 7/16

FOREIGN PATENT DOCUMENTS

DE 102024201319 A1 * 11/2024 ........... H05K 1/0201
JP 2014119461 A * 6/2014 ............. H10F 71/00
KR 20180136994 A * 12/2018 ............ H10W 90/00
WO WO-2013127045 A1 * 9/2013 ............ H10W 99/00
WO WO-2016129288 A1 * 8/2016 ............. G01R 33/09
WO WO-2019043299 A1 * 3/2019 ............ H10W 90/00
WO WO-2019199445 A1 * 10/2019 ............ H10W 72/90
WO WO-2024207789 A1 * 10/2024 ............ H10W 72/20

* cited by examiner

RESISTANCE TEMPERATURE DETECTOR AT HYBRID BONDING INTERFACE

BACKGROUND

The present application relates to a resistance temperature detector (RTD), and more particularly to a RTD that is located at a hybrid bonding interface.

Resistance thermometers, also called resistance temperature detectors (RTDs), are sensors used to measure temperature. Many RTD elements consist of a length of fine wire wrapped around a heat-resistant ceramic or glass core, but other constructions are also used. The RTD wire is a metal, typically platinum (Pt), nickel (Ni), or copper (Cu). The metal has an accurate resistance/temperature relationship which is used to provide an indication of temperature.

RTDs are constructed in a number of forms and offer greater stability, accuracy and repeatability in some cases than thermocouples. While thermocouples use the Seebeck-effect to generate a voltage, resistance thermometers use electrical resistance and require a power source to operate. The resistance ideally varies nearly linearly with temperature.

SUMMARY

A structure is provided in which a RTD is located at a hybrid bonding interface between a resistance temperature detector (RTD)-containing structure and a device-containing structure. The RTD can measure and study the temperature at the hybrid bonding interface. The structure containing the RTD can be connected to an external device and collection of current reading can be made. Changes in the current readings can be attributed to changes in the resistance (I=V/R). The current can be modeled to achieve a temperature value.

In one embodiment of the present application, the structure includes a hybrid bonding interface located between an RTD-containing structure and a device-containing structure. In such a structure, the RTD-containing structure includes RTD wiring including a first RTD wiring region electrically connected to a RTD resistive element, and a second RTD wiring region electrically connected to the first RTD wiring region. The device-containing structure of the present application includes a first electrically conductive interconnect region and a second electrically conductive interconnect region. In the present application, the RTD resistive element is electrically connected to the first electrically conductive interconnect region at the hybrid bonding interface and the second electrically conductive interconnect region is electrically connected to the second RTD wiring region at the hybrid bonding interface.

DETAILED DESCRIPTION

Figure 1:
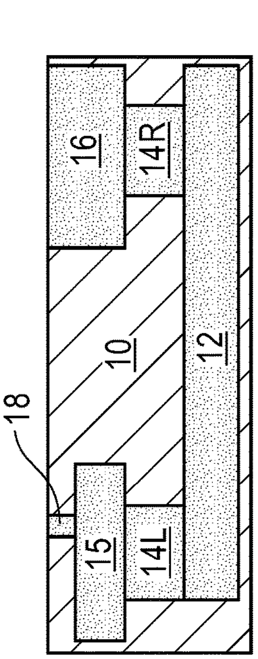
FIG. 1 is a cross sectional view of a first exemplary structure that can be used in the present application, the first exemplary structure including a first dielectric region including RTD wiring embedded therein.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

Throughout the present application, the term "hybrid bonding" denotes dielectric-to-dielectric bonding and metal-to-metal bonding such that a hybrid bonding interface is formed between the bonded dielectric materials and the bonded metals. Throughout the present application, the term "hybrid bonding interface" denotes an interface containing dielectric-to-dielectric bonding and metal-to-metal bonding.

Referring first to FIG. 1, there is illustrated a first exemplary structure that can be used in the present application. The first exemplary structure includes a first dielectric region 10 including RTD wiring embedded therein. Although not shown, the first dielectric region 10 can be located on a carrier wafer. The first dielectric region 10 and the RTD wiring embedded therein collectively can be referred to a first back-end-on-the-line (BEOL) structure.

The RTD wiring includes a first RTD wiring region including a first electrically conductive via 14L and a first electrically conductive line 15. A RTD device contact via 18 is located in the first RTD wiring region that electrically contacts the first electrically conductive line 15 of the first RTD wiring region. The RTD wiring further includes a second RTD wiring region including a second electrically conductive via 14R and a second electrically conductive line 16. The RTD wiring region also includes a bottommost electrically conductive line 12 that electrically interconnects the first wiring region to the second wiring region. Notably, the bottommost electrically conductive line 12 is in direct physical contact with both the first electrically conductive via 14L and the second electrically conductive via 14R.

The first dielectric region 10 is composed of at least one dielectric material. Typically, the first dielectric region 10 is composed of a stack of dielectric materials that can be composed of a compositionally same, or compositionally different dielectric material. The dielectric material that can be employed in the present application as the first dielectric region 10 includes, but is not limited to, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0 (all dielectric constants mentioned herein are relative to a vacuum unless otherwise noted).

The RTD wiring including the first electrically conductive via 14L, the first electrically conductive line 15, the second electrically conductive via 14R, the second electrically conductive line 16, and the bottommost electrically conductive line 12 as well as the RTD device contact via 18 are composed of an electrically conductive metal or an electrically conductive metal alloy. Illustrative examples of electrically conductive metals that can be used in forming the RTD wiring and the RTD device contact via 18 include, but are not limited to, Cu, Al, Co, Ru, Mo, Os, Ir, or Rh. An illustrative electrically conductive alloy that can be used in forming the metal wires includes, but is not limited to, a Cu—Al alloy. In some embodiments, the RTD wiring including the first electrically conductive via 14L, the first electrically conductive line 15, the second electrically conductive via 14R, the second electrically conductive line 16, and the bottommost electrically conductive line 12 as well as the RTD device contact via 18 can be composed of a compositionally same electrically conductive material. For example, Cu can be used for each the first electrically conductive via 14L, the first electrically conductive line 15, the RTD device contact via 18, the second electrically conductive via 14R, the second electrically conductive line 16, and the bottommost electrically conductive line 12. In other embodiments, the RTD wiring and the RTD device contact via 18 can be composed of compositionally different electrically conductive materials. For example, the first RTD wiring region including the first electrically conductive via 14L, the first electrically conductive line 15, the second RTD wiring region including the second electrically conductive via 14R and the second electrically conductive line 16 and the bottommost electrically conductive line 12 are composed of Cu, and the RTD device contact via 18 is composed of Co.

The first exemplary structure illustrated in FIG. 1 can be formed utilizing a metallization process that is well known to those skilled in the art. The metallization process can include forming a dielectric layer (including one of the dielectric materials mentioned above), forming an opening (line or via) into the dielectric layer, and then filling the opening with one of the electrically conductive metals or electrically conductive metal alloys mentioned above. The steps of dielectric layer formation, opening formation, and electrically conductive material fill can be repeated to provide the first exemplary structure shown in FIG. 1. The forming the dielectric layer includes depositing one of the dielectric materials mentioned above. The depositing of the dielectric material can include, for example, chemical vapor deposition (CVD), plasma enhanced chemical vapor deposition (PECVD) or spin-on coating. The forming of the opening can include lithography and etching. Lithography includes forming (by a deposition process) a photoresist material on a layer or structure that needs to be patterned, exposing the as-deposited photoresist material to a desired pattern of irradiation, and developing the exposed photoresist material. The etching can include a dry etching process or a wet etching process. Drying etching can include, for example, reactive ion etching (RIE), laser etching, or plasma etching. Wet etching includes the use of a chemical etchant. The filling of the opening includes depositing an electrically conductive metal or an electrically conductive metal alloy, as defined above, and then performing a planarization process such as, for example, chemical mechanical polishing (CMP), to remove any of the as-deposited electrically conductive material that is formed outside of the opening. The depositing of the electrically conductive material can include, but is not limited to, CVD, PECVD, atomic layer deposition (ALD), sputtering or plating.

Figure 2:
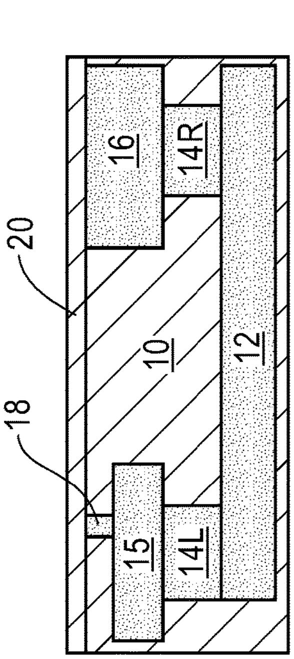
FIG. 2 is a cross sectional view of the first exemplary structure of FIG. 1 after forming a bonding dielectric layer on top of the first dielectric region.

Referring now to FIG. 2, there is illustrated the first exemplary structure of FIG. 1 after forming a bonding dielectric layer 20 on top of the first dielectric region. 10. Notably, the bonding dielectric layer 20 is formed on top of an uppermost dielectric material of the first dielectric region 10 as well as on top of both the RTD device contact via 18 and the second electrically conductive line 16 of the second RTD wiring region. The bonding dielectric layer 20 is composed of any bonding dielectric material such as, for example, tetraethyl orthosilicate (TEOS), silicon dioxide ($SiO_2$), silicon carbon nitride (SiCN) and/or carbon-doped silicon oxide (SiCOH). The bonding dielectric material that provides the bonding dielectric layer 20 can be compositionally the same as, or compositionally different from, the uppermost dielectric material of the first dielectric region 10. The bonding dielectric layer 20 can be formed by a deposition process such as, for example, CVD, PECVD, ALD, or physical vapor deposition (PVD).

Figure 3:
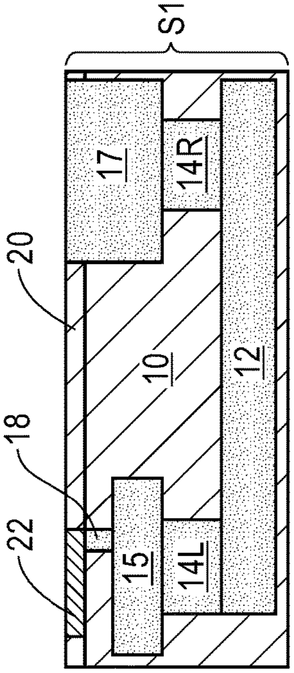
FIG. 3 is a cross sectional view of the first exemplary structure of FIG. 2 after forming a RTD resistive element in contact with a RTD device contact via that is formed on the RTD wiring.

Referring now to FIG. 3, there is illustrated the first exemplary structure of FIG. 2 after forming a RTD resistive element 22 in contact with the RTD device contact via 18 of the RTD wiring. Notably, the RTD resistive element 22 is formed by first forming (by lithography and etching) a RTD resistive element contact opening (not shown) in the bonding dielectric layer 20. The RTD resistive element contact opening is then filled with a resistive material such as, for example, Pt, or Ni. The resistive material has a higher resistance to the flow of electric current than the electrically conductive material (e.g., Cu) that is used in providing the RTD wiring and the RTD device contact via 18. The resistive material used in providing the RTD resistive element 22 also has a higher resistance to the flow of electric current than the electrically conductive material used in providing the electrically conductive interconnect structures and the carrier contact via structure 34 in the second exemplary structure shown in FIGS. 4 and 5. The filling includes deposition (e.g., CVD, PECVD, ALD, sputtering or plating) and a planarization process such as, for example, (CMP). The RTD resistive element 22 typically has a meandering (i.e., serpentine) pattern (which provides enhanced surface area) as well be more apparent from the top down view illustrated in FIG. 8 of the present application.

Either before or after forming the RTD resistive element 22, an opening is formed in the bonding dielectric layer 20 (by lithography and etching) that physically exposes the second electrically conductive line 16 of the second RTD wiring region. This opening is then filled (deposition and planarization) with an electrically conductive metal or electrically metal alloy that can be compositionally the same as, or compositionally different from the electrically conductive metal electrically conductive metal alloy that provides the second electrically conductive line 16. Collectively, the second electrically conductive line 16 and the electrically conductive metal or electrically metal alloy that is formed in the opening in the bonding dielectric layer 20 provide a first metal bond pad 17 of the structure. The first metal bond pad 17 is a component of the second RTD wiring region.

As is shown in FIG. 3, an RTD-containing structure S1 is provided. The RTD-containing structure S1 includes the RTD resistive element 22 embedded in the bonding dielectric layer 20. Collectively, the RTD resistive element 22 and the bonding dielectric layer 20 can be referred to as an RTD. The RTD-containing structure S1 further includes the first RTD wiring region, as mentioned above, interconnected to the second RTD wiring region (that now includes the first metal bond pad 17) by the bottommost electrically conductive line 12. In the present application, the RTD resistive element 22 is electrically connected to the first RTD wiring region by the RTD device contact via 18.

Figure 4:
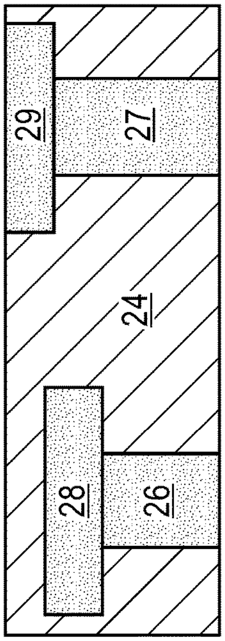
FIG. 4 is a cross sectional view of a second exemplary structure that can be employed in the present application, the second exemplary structure including a second dielectric region having electrically conductive interconnect structures embedded therein.

Referring now to FIG. 4, there is illustrated a second exemplary structure that can be employed in the present application. The second exemplary structure includes a second dielectric region 24 having electrically conductive interconnect structures embedded therein. Although not shown in FIGS. 4 and 5, the second dielectric region 24 can be located on a device level (as shown in FIG. 6) that includes various semiconductor devices, e.g., transistors, capacitors, and/or resistors, located on a semiconductor wafer. The second dielectric region 24 and the electrically conductive interconnect structures embedded therein collectively can be referred to a second BEOL structure. Although not shown, the electrically conductive interconnect structures within the second dielectric region are connected to the semiconductor devices that are within the device level.

The electrically conductive interconnect structures include a first electrically conductive interconnect region of a first electrically conductive interconnect via 26 and a first electrically conductive interconnect line 28, and a second electrically conductive interconnect region of a second electrically conductive interconnect via 27 and a second metal bond pad 29. In the second exemplary structure shown in FIG. 4, the first electrically conductive interconnect region is not directly interconnected to the second electrically conductive interconnect region. The first electrically conductive interconnect via 26, the first electrically conductive interconnect line 28, the second electrically conductive interconnect via 27 and the second metal bond pad 29 are composed of an electrically conductive metal or an electrically conductive metal alloy, as defined above. In the present application, the first electrically conductive interconnect region is spaced apart from the second electrically conductive interconnect region by a dielectric material of a second dielectric region 24.

The second dielectric region 24 is composed of at least one dielectric material (as defined above for the first dielectric region 10) with the proviso that that uppermost dielectric material of the second dielectric region 24 is composed of a bonding dielectric material as defined above Typically, the second dielectric region 24 is composed of a stack of dielectric materials that can be composed of a compositionally same, or compositionally different dielectric material, with proviso the uppermost dielectric material is a bonding dielectric material such as, for example, TEOS, $SiO_2$, SiCN or SiCOH. The second exemplary structure illustrated in FIG. 2 can be formed utilizing a metallization process as defined above.

Figure 5:
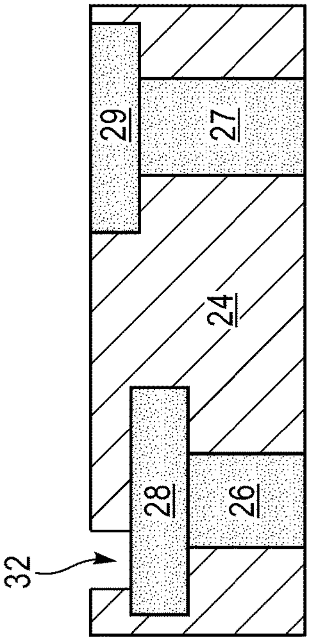
FIG. 5 is a cross sectional view of the second exemplary structure of FIG. 4 after forming a contact opening in second dielectric region.
Figure 6:
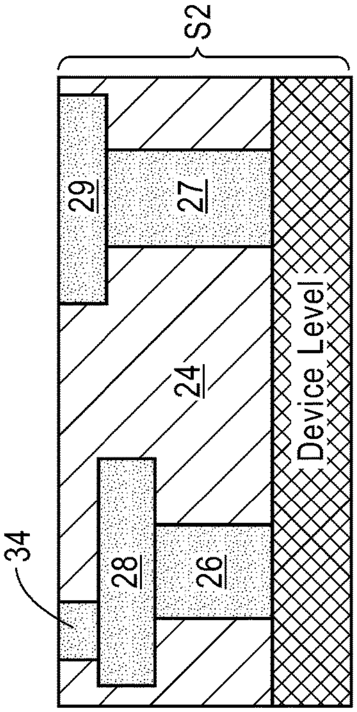
FIG. 6 is a cross sectional view of the second exemplary structure of FIG. 5 after forming a carrier contact via structure in the contact opening.

Referring now to FIG. 5, there is illustrated the second exemplary structure of FIG. 4 after forming a contact opening 32 in second dielectric region 24. Contact opening 32 is formed in the uppermost dielectric material (i.e., the dielectric bonding material) of the second dielectric region 24 and the contact opening 32 physically exposes a surface of the first electrically conductive interconnect line 28. The contact opening 32 can be formed by lithography and etching as defined above.

Referring now to FIG. 6, there is illustrated the second exemplary structure of FIG. 5 after forming a carrier contact via structure 34 in the contact opening 32. Carrier contact via structure 34 is composed of an electrically conductive metal or an electrically conductive metal alloy, as defined above. The electrically conductive material that is used in providing the carrier contact via structure 34 can be compositionally the same as, or compositionally different from, the electrically conductive material that provides the first electrically conductive interconnect line 28. The carrier contact via structure 34 can be formed by filling (i.e., deposition and planarization) that contact opening 32 with an electrically conductive material. The carrier contact via structure 34 directly contacts the first electrically conductive interconnect line 28.

As is shown in FIG. 6, a device-containing structure S2 is provided. The device-containing structure S2 includes the first electrically conductive interconnect region (including the first electrically conductive interconnect via 26, the first electrically conductive interconnect line 28), the carrier contact via structure 34 and the second electrically conductive interconnect region (including the second electrically conductive interconnect via 27 and the second metal bond pad 29). The device-containing structure S2 would also include the device level mentioned above.

Figure 7:
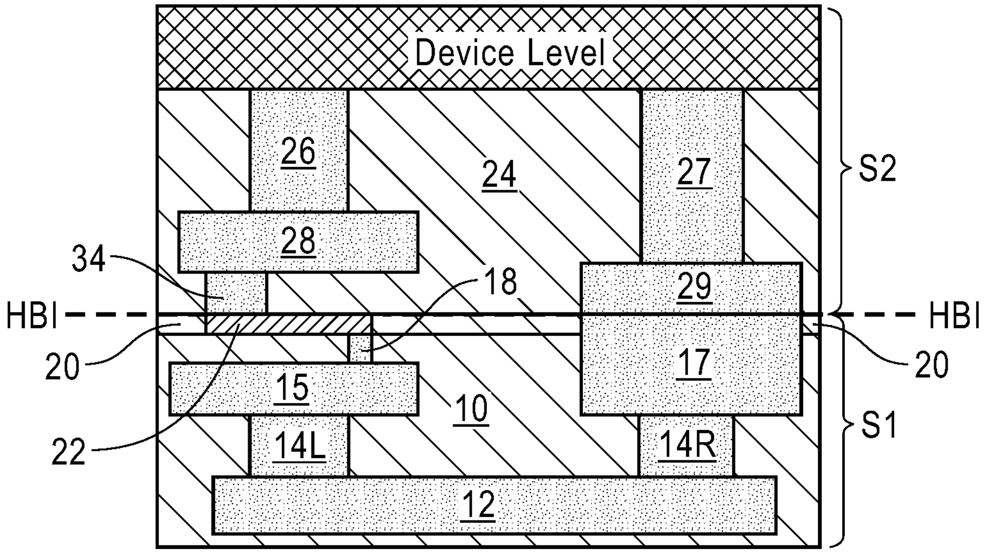
FIG. 7 is a cross sectional view of the first exemplary structure shown in FIG. 3 and the second exemplary structure shown in FIG. 6 after flipping the second exemplary structure shown in FIG. 6, aligning the flipped second exemplary structure over the first exemplary structure shown in FIG. 3, and performing a bonding process.

Referring now to FIG. 7, there is illustrated the first exemplary structure shown in FIG. 3 and the second exemplary structure shown in FIG. 6 after flipping the second exemplary structure shown in FIG. 6, aligning the flipped second exemplary structure over the first exemplary structure shown in FIG. 3, and performing a bonding process (i.e., hybrid bonding process). In the present application, the device-containing structure S2 shown in FIG. 6 is flipped 180°. Flipping can be performed by hand or by utilizing a mechanical means such as, for example, a robot arm. The aligning includes positioning the flipped device-containing structure S2 over the RTD-containing structure S1 such that second metal bond pad 29 is aligned over the first metal bond pad 17 and such that the carrier contact via structure 34 is aligned over a portion of the RTD resistive element 22.

The flipped and aligned device-containing structure S2 is then brought into intimate contact with the RTD-containing structure S1, and thereafter the bonding process is performed to provide a structure having a RTD resistive element 22 that is located at a hybrid bonding interface HBI. In the present application and after bonding, the RTD resistive element 22 is in contact with the first electrically conductive interconnect region by the carrier contact via structure 34. The bringing the flipped and aligned device-containing structure S2 into intimate contact with the RTD-containing structure S1 can include the application of an external force which may or may not remain during the actual bonding process. The bonding process (which can also be referred to a hybrid bonding process) includes metal-to-metal bonding and dielectric-to-dielectric bonding. The bonding process includes heating the intimately contacted and aligned structures from room temperature (i.e., 20° C.-25° C.) up to 450° C.; temperatures greater than 450° C. can also be used in the present application. The bonding process is typically performed in an inert ambient such as, for example, He, Ar, Ne or mixtures thereof. After bonding, the temperature can be lowered back to room temperature. The bonding process can also include an activation process as described below.

Hybrid bonding refers to a 3D packing technique to connect semiconductor builds. Hybrid bonding forms connections of semiconductor structures through metal bond pads which are embedded in a dielectric layer at a bond interface on each semiconductor structure that is being bonded. The dielectric layer at bond interface include, but is not necessarily limited to, TEOS, $SiO_2$, SiCN, and/or SiCOH. The metal bond pads embedded in the dielectric surfaces most commonly include, but are not necessarily limited to, copper (Cu). As part of the hybrid bonding process, the aforementioned dielectric materials go through an activation process, including but not necessarily limited to, $O_2/N_2$ plasma activation followed by a de-ionized water rinsing. Such activation process creates surface dangling bonds through hydroxylation of dielectric surfaces. Hybrid bonding process itself includes alignment to control the overlay of metal pads and to ensure electrical continuity between semiconductor build undergoing hybrid bonding process, mating of dielectric/metal pad surfaces, annealing under a set pressure. The anneal process of the mated semiconductor builds ensures formation of covalent bonds between the dangling bonds across the dielectric surfaces of opposing semiconductor builds, as well as reflow (melting and joining) of the metal pads between the surfaces of opposing semiconductor builds to ensure electrical conductivity. The covalent bonds formed between the dielectric surfaces, and the joining of metal pads as a result of reflow process ensures that hybrid bonding interfaces joins two semiconductor builds and also ensures that there is electrical continuity between them. The dangling bonds and covalent bonding occurs in the present application.

Notably, and in the present application, the bonding process bonds the second metal bond pad 29 to the first metal bond pad 27 (metal-to-metal bond is formed), bonds the carrier contact via structure 34 to the RTD resistive element 22 (metal-to-metal bond is formed), and bonds the bonding dielectric material of the device-containing structure S2 to the bonding dielectric layer 20 of the RTD-containing structure S1 (dielectric-to-dielectric bond is formed). The bonding process forms a bonding interface, HBI, as shown in FIG. 7. Notably, the HBI is present between the bonded second metal bond pad 29 and the first metal bond pad 27, the bonded carrier contact via structure 34 and the RTD resistive element 22, and the bonded bonding dielectric material of the device-containing structure S2 and the bonding dielectric layer 20 of the RTD-containing structure S1. The HBI thus contains metal-to-metal bonding and dielectric-to-dielectric bonding. The HBI also connects the carrier contact via structure 34 to the RTD resistive element 22. After bonding the RTD resistive element 22 is electrically connected to both the first RTD wiring region (by the RTD device contact via 18) and the first electrically conductive interconnect region (by the carrier contact via structure 34).

In one embodiment of the present application and as is shown in FIG. 7, the structure includes a hybrid bonding interface HBI located between RTD-containing structure S1 and device-containing structure S2. In such a structure, the RTD-containing structure S1 includes RTD wiring that includes a first RTD wiring region (as defined above) electrically connected to a RTD resistive element 22 (via the RTD device contact via 18), and a second RTD wiring region (as defined above) electrically connected to the first RTD wiring region (via the bottommost electrically conductive line 12). The device-containing structure S2 includes a first electrically conductive interconnect region (as defined above) and a second electrically conductive interconnect region (as defined above). In the present application, the RTD resistive element 22 is also electrically connected to the first electrically conductive interconnect region at the hybrid bonding interface HBI (via the carrier contact via structure 34), and the second electrically conductive interconnect region is electrically connected to the second RTD wiring region (via the bonded first metal bond pad 17 and the second metal bond pad 29) at the hybrid bonding interface HBI.

Figure 8:
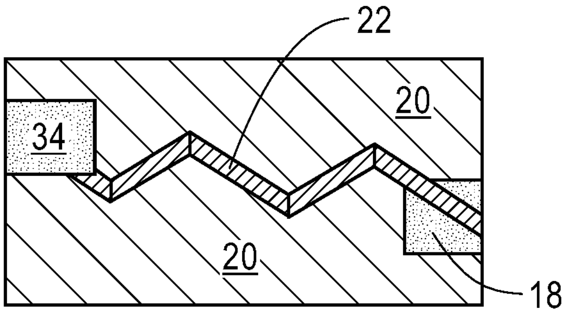
FIG. 8 is a top down view highlighting a meandering pattern of the RTD resistive element.

Referring now to FIG. 8, there is illustrated a top down view highlighting a meandering pattern of the RTD resistive element 22. This top down view begins from a topmost surface of the carrier contact via structure 34 and omits the second dielectric region 24 for clarity. The meandering pattern provides increased surface area to the RTD resistive element 22.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:

a hybrid bonding interface located between a resistance temperature detector (RTD)-containing structure and a device-containing structure, the RTD-containing structure comprises RTD wiring comprising a first RTD wiring region electrically connected to a RTD resistive element, and a second RTD wiring region electrically connected to the first RTD wiring region, and the device-containing structure comprises a first electrically conductive interconnect region and a second electrically conductive interconnect region, wherein the RTD resistive element is also electrically connected to the first electrically conductive interconnect region at the hybrid bonding interface and the second electrically conductive interconnect region is electrically connected to the second RTD wiring region at the hybrid bonding interface;

wherein the RTD wiring is electrically connected to the RTD resistive element by a RTD device contact via that is present in the RTD-containing structure; and wherein the RTD resistive element has a meandering pattern.

2. The structure of claim 1, wherein the second RTD wiring region is electrically connected to the first RTD wiring region by a bottommost electrically conductive line that is present in the RTD-containing structure.

3. The structure of claim 1, wherein the RTD resistive element is electrically connected to the first electrically conductive interconnect region at the hybrid bonding interface by a carrier contact via structure that is present in the device-containing structure.

4. The structure of claim 3, wherein a metal-to-metal bond is present between the RTD resistive element and the carrier contact via structure at the hybrid bonding interface.

5. The structure of claim 1, wherein the second electrically conductive interconnect region is electrically connected to the second RTD wiring region by a metal-to-metal bond that forms between a first metal bond pad of the second RTD wiring region and a second metal bond pad of the second electrically conductive interconnect region.

6. The structure of claim 1, wherein the RTD-containing structure comprises a first dielectric region that embeds the RTD wiring, and a bonding dielectric layer that is located on top of the first dielectric region that embeds the RTD resistive element, and the device-containing structure comprises a second dielectric region that embeds the first electrically conductive interconnect region and a second electrically conductive interconnect region.

7. The structure of claim 6, wherein an uppermost layer of the second dielectric region comprises a bonding dielectric material.

8. The structure of claim 6, wherein the bonding dielectric layer of the RTD-containing structure forms a dielectric-to-dielectric bond with the bonding dielectric material of the second dielectric region at the hybrid bonding interface.

9. The structure of claim 1, wherein the first electrically conductive interconnect region is spaced apart from the second electrically conductive interconnect region by a dielectric material of a second dielectric region that embeds the first electrically conductive interconnect region and the second electrically conductive interconnect region.

10. The structure of claim 1, wherein the device-containing structure includes a second dielectric region that embeds the first electrically conductive interconnect region and the second electrically conductive interconnect region, and a device level located on the second dielectric region.

11. The structure of claim 1, wherein the first RTD wiring region comprises a first electrically conductive via and a first electrically conductive line, and the second RTD wiring region comprises a second electrically conductive via and a second electrically conductive line and wherein a bottommost electrically conductive line of the RTD wiring electrically interconnects the first wiring region to the second wiring region.

12. The structure of claim 1, wherein the RTD resistive element has a higher resistance to flow of electric current than RTD wiring, the first electrically conductive interconnect region, and the second electrically conductive interconnect region.

13. The structure of claim 12, wherein the RTD resistive element is composed of Pt or Ni, and the RTD wiring, the first electrically conductive interconnect region, and the second electrically conductive interconnect region are composed of Cu.

* * * * *